(12) United States Patent
Dennler

(10) Patent No.: US 9,634,630 B2
(45) Date of Patent: Apr. 25, 2017

(54) AMPLIFIER

(71) Applicant: Fraunhofer-Gesellschaft zur Forderung der angewandten Forschung e.V., Munich (DE)

(72) Inventor: Philippe Dennler, Basel (CH)

(73) Assignee: FRAUNHOFER-GESELLSCHAFT ZUR FORDERUNG DER ANGEWANDTEN FORSCHUNG E.V., Munich (DE)

( * ) Notice: Subject to any disclaimer, the term of this patent is extended or adjusted under 35 U.S.C. 154(b) by 28 days.

(21) Appl. No.: 14/287,282

(22) Filed: May 27, 2014

(65) Prior Publication Data

US 2014/0347123 A1   Nov. 27, 2014

(30) Foreign Application Priority Data

May 24, 2013   (DE) ........................ 10 2013 209 686

(51) Int. Cl.
   *H03F 3/68* (2006.01)
   *H03F 3/55* (2006.01)
   (Continued)

(52) U.S. Cl.
   CPC .................. *H03F 3/55* (2013.01); *H03F 1/42* (2013.01); *H03F 3/19* (2013.01); *H03F 3/195* (2013.01);
   (Continued)

(58) Field of Classification Search
   CPC .......... H03F 3/211; H03F 3/602; H03F 3/604; H03F 3/72; H03F 1/0288; H03F 3/607;
   (Continued)

(56) References Cited

U.S. PATENT DOCUMENTS 4,668,920 A    5/1987   Jones
5,111,157 A *  5/1992   Komiak ........................ 330/295
(Continued)

FOREIGN PATENT DOCUMENTS

EP    1039574    9/2000
EP    2541762    1/2013

OTHER PUBLICATIONS

Gonzales, G., "Microwave Transistor Amplifiers", Prentice Hall, 1997, pp. 112-114.
(Continued)

*Primary Examiner* — Khanh V Nguyen
(74) *Attorney, Agent, or Firm* — Volpe and Koenig, P.C.

(57) ABSTRACT

An amplifier (1) is provided, in particular, wideband amplifier with an input (4) and an output (5) comprising a first amplifier stage (2) and a second amplifier stage (3), wherein the first amplifier stage (2) has an active power splitter with at least one injection point, wherein this injection point corresponds to the input (4) of the amplifier, and at least two discharge points (9a, 9b), wherein this active power splitter is formed according to a traveling wave amplifier principle and the second amplifier stage (3) has at least two injection points (11a, 11b) and at least one discharge point, wherein this discharge point corresponds to the output (5) of the amplifier and is formed as a power coupler. It is essential that the second amplifier stage (3) is formed as a power coupler, wherein this power coupler is formed according to the principle of a reactively matched amplifier.

15 Claims, 2 Drawing Sheets

(51) Int. Cl.
*H03F 1/42* (2006.01)
*H03F 3/19* (2006.01)
*H03F 3/21* (2006.01)
*H03F 3/195* (2006.01)
*H03F 3/24* (2006.01)
*H03F 3/60* (2006.01)

(52) U.S. Cl.
CPC .............. *H03F 3/211* (2013.01); *H03F 3/245* (2013.01); *H03F 3/602* (2013.01); *H03F 3/68* (2013.01); *H03F 2200/222* (2013.01); *H03F 2200/318* (2013.01); *H03F 2200/387* (2013.01); *H03F 2200/39* (2013.01); *H03F 2200/411* (2013.01); *H03F 2200/423* (2013.01)

(58) Field of Classification Search
CPC ........ H03F 3/24; H03F 2200/451; H03F 1/20; H04B 3/06
USPC ................. 330/53, 54, 124 R, 286, 295, 302
See application file for complete search history.

(56) References Cited

U.S. PATENT DOCUMENTS

| | | | |
|---|---|---|---|
| 5,208,554 A * | 5/1993 | Endler et al. | 330/295 |
| 8,710,928 B2 * | 4/2014 | Ng | 330/295 |
| 2009/0309659 A1 | 12/2009 | Lender, Jr. et al. | |
| 2012/0049952 A1 * | 3/2012 | Ng | 330/126 |

OTHER PUBLICATIONS

Juschke, P. et al., "Multiband Doherty RF Power Amplifier", In: IEEE AFRICON, 2011, Livingstone, Zambia, Sep. 13-15, 2011, pp. 1-5.

* cited by examiner

US 9,634,630 B2

AMPLIFIER

INCORPORATION BY REFERENCE

The following documents are incorporated herein by reference as if fully set forth: German Patent Application No. 10 2013 209 686.0, filed May 24, 2013.

BACKGROUND

The invention relates to an amplifier, in particular, a wideband amplifier with a first amplifier stage and a second amplifier stage.

Such an amplifier has an output and an input and comprises a first amplification stage and a second amplification stage, wherein the first amplification stage has an active power splitter with at least one injection point, wherein this injection point corresponds to the input of the amplifier, and at least two discharge points. The active power splitter is formed according to the principle of a traveling wave amplifier. The second amplification stage has at least two injection points and at least one discharge point, wherein this discharge point corresponds to the output of the amplifier, wherein the second amplification stage is formed as a power coupler. Such an amplifier is known from U.S. Pat. No. 4,668,920.

Amplifiers are typically formed today with the use of semiconductor components, e.g., transistors. These transistors have internal parasitic capacitances and inductances. Due to these parasitic capacitances and inductances, an input impedance and an output impedance of a transistor are dependent on frequency. These effects must be compensated for in a design of amplifiers. This is typically realized by so-called matching networks. Here, a pure real input impedance, that is, an ohmic input resistance, of the environment in which the amplifier is to be used is transformed into a corresponding complex impedance on an input of the transistor. After an amplification by the transistor, typically a transformation of the complex impedance into a pure real output impedance is performed, that is, an ohmic output resistance.

It is known to use this transformation in so-called reactively matched amplifiers.

The transformation of complex impedances into real resistances and vice versa, and thus the compensation of the disruptive effects named above, however, is possible only in a certain frequency range, so that matching amplifiers have a limited bandwidth (Bode-Fano criterion and/or maximum realizable transformation ratio). In a multi-stage amplifier (e.g., a two-stage amplifier), the active components of two successive amplification stages are adapted to each other.

A disadvantage in the reactively-matched amplifiers from the prior art, as already described, is the bandwidth restriction due to the Bode-Fano criterion and/or the maximum transformation ratio that can be realized.

Alternatively, from the prior art it is known to use so-called traveling wave amplifiers. Traveling wave amplifiers are not subject to the Bode-Fano criterion.

A disadvantage in traveling wave amplifiers according to the prior art, however, is that the amplification and output power per surface area and also the maximum achievable output power are insufficient. In comparison with corresponding reactively matched amplifiers, they also have a lower power efficiency.

SUMMARY

The present invention is therefore based on the objective of providing an amplifier that allows, in a wide frequency range, sufficient amplification and output power with sufficient power efficiency.

This objective is met by an amplifier having one or more features according to the inventions an input and an output and comprises, as is known, a first amplification stage and a second amplification stage, wherein the first amplification stage has an active power splitter with at least one injection point, wherein this injection point corresponds to the input of the amplifier, and at least two discharge points, wherein the active power splitter is formed according to the principle of a traveling wave amplifier. The second amplification stage has at least two injection points and at least one discharge point, wherein this discharge point corresponds to the output of the amplifier, and is formed as a power coupler.

It is essential that the second amplification stage is formed as a power coupler, wherein this power coupler is formed according to the principle of a reactively matched amplifier.

The invention is based on the fact, in the findings of the applicant, that in typical multi-stage amplifiers known from the prior art, complex impedances occur between the amplification stages. Therefore, two complex impedances are matched to each other. These two complex impedances rotate in opposite directions in a Smith chart with respect to frequency. Thus it is significantly more demanding to match two complex impedances accordingly, compared with the matching of a complex impedance to a pure ohmic resistance. Because it is not possible to optimally match two complex impedances whose values rotate opposite each other in a Smith chart with respect to frequency, power losses must be expected. However, in order to prevent a decrease in amplification at high frequencies, it is essential to provide multiple amplification stages in an amplifier. The amplifier according to the invention thus has the advantage of a multi-stage amplifier and avoids the disadvantage of a matching of two complex impedances between the amplification stages.

This produces, in particular, the advantage that the proposed multi-stage amplifier has one amplification and one power efficiency lying in the range of conventional reactively matched amplifiers and also can be used in a comparatively larger frequency range. In addition, two injection points are available for the second amplifier stage due to the construction of the first amplifier stage as a power splitter.

The formation of the second amplifier stage according to the principle of a reactively matched amplifier can be realized in a known way, as described, for example, in Microwave Transistor Amplifiers, Gonzales, G., Prentice Hall, 1997, p. 112 ff.

Advantageously, the first amplifier stage with its components and the second amplifier stage with its components are arranged on one substrate. The substrate has a starting area, an end area, and edge areas. In the scope of this description, edge areas of the substrate mean the areas extending along the edges of the substrate not corresponding to the starting area of the end area of the substrate. Advantageously, the edge areas each extend starting from the edge of the substrate over approximately 30% of the surface area in the direction toward the middle of the substrate. Advantageously, the substrate has an upper and a lower edge area. Thus, in sequence, starting at the starting area there follows the upper edge area, then the end area, and then the lower edge area that is, in turn, adjacent to the starting area. The substrate is typically formed as a circuit board or another substrate, in particular, a semiconductor substrate.

In one advantageous embodiment, the second amplification stage comprises at least two input matching networks, at least two transistors and at least two output matching networks, wherein, in each of the input matching networks, an input transformation of a real input resistance into a first complex impedance is performed and in each of the output matching networks, an output transformation of a second complex impedance into a real output resistance is performed. The transformation of the pure real input resistance, that is, a pure ohmic resistance, into the complex impedance can be performed as is known from the prior art by impedance matching. This also applies to the transformation of the complex impedance into a real output resistance.

The at least two input matching networks and also the two output matching networks are formed in a known way and method, as described, for example, in Microwave Transistor Amplifiers, Gonzales, G., Prentice Hall, 1997, p. 112 ff. This produces the advantage that only the matching of complex impedances to ohmic impedances is necessary. The far more demanding transformation with greater losses due to physics of a complex impedance to a second complex impedance can be eliminated despite the use of two amplifier stages.

In one preferred embodiment, the plurality of transistors of the first amplifier stage is formed with respect to its physical properties essentially mirror symmetric on the substrate with respect to a connection of the input and the output. This produces the advantage that an in-phase coupling of the signals into the second amplifier stage is performed.

It is likewise in the scope of the invention that the at least two transistors have different properties, e.g., with respect to transistor surface area, amplification, and/or material.

It also lies in the scope of the invention that different transformations take place in the at least two input matching networks: the one real input resistance of a first input matching network thus can differ from the other real input resistance of a second input matching network. Thus the transformation that takes place in the first input matching network also differs from the transformation that takes place in the second input matching network.

This applies analogously to the transformations in the at least two output matching networks: the one complex impedance of a first output matching network thus can differ from the other complex impedance of a second output matching network. Thus, the transformation that takes place in the first output matching network also differs from the transformation that takes place in the second output matching network.

In another preferred embodiment, the power coupler is formed such that a first series circuit made from a first input matching network, first transistor, and first output matching network is coupled with a second series circuit made from a second input matching network, second transistor, and second output matching network. This makes possible a simple and space-saving construction of the power coupler such that the power coupler acts as a second amplification stage.

In another preferred embodiment, the power coupler is formed and arranged on the substrate such that the distance between the first output matching network and the second output matching network is less than the distance between the first input matching network and the second input matching network. This produces the advantage that an inductance can be placed close to a drain of each of the at least two transistors and thus an effective compensation of the parasitic capacitances on the outputs of the transistors is made possible.

In another preferred embodiment, the first amplifier stage and/or the second amplifier stage comprise at least one integrated circuit. This produces the advantage that, by means of the integrated circuit, the parasitic capacitances and inductances can be compensated spatially close to the transistors using circuitry. Therefore larger bandwidths can be achieved. It also lies in the scope of the invention that the first amplifier stage and/or the second amplifier stage comprise hybrid circuits and/or discrete circuits.

In another preferred embodiment, the at least two discharge points of the first amplification stage are each coupled with an associated injection point of the at least two injection points of the second amplification stage. The at least two discharge points of the first amplifier stage coupled with the at least two injection points of the second amplifier stage thus represent the connection points between the first amplifier stage and the second amplifier stage. Advantageously, a pure real resistance, that is, an ohmic resistance is passed at these connection points.

In another preferred embodiment, the input of the amplifier is arranged essentially in the middle in the starting area of the substrate and/or the output of the amplifier essentially in the middle in the end area of the substrate. In this arrangement, the amplifier can be arranged in a simpler and space-saving way on the substrate, advantageously symmetric with respect to a connection of the input and the output on the substrate. The amplifier can also be arranged advantageously mirror symmetric with respect to a center axis on the substrate.

In another preferred embodiment, the amplifier comprises two discharge points of the first amplifier stage and two associated injection points of the second amplifier stage, wherein the two discharge points of the first amplifier stage and thus the two injection points of the second amplifier stage are arranged in opposing edge areas of the substrate. The two discharge points of the first amplifier stage and the two associated injection points of the second amplifier stage together form connection points between the first amplifier stage and the second amplifier stage. Thus, the connection points are advantageously arranged in opposite edge areas of the substrate, in particular, at opposite edges of the substrate. This produces the advantage that there is sufficient space for the arrangement of advantageously also additional components between the outer-lying connection points and the output of the amplifier. For example, the transistors of the second amplifier stage can each be realized as two opposing transistors such that the two drains of the transistors are facing each other. Advantageously, the distance between the drains of opposing transistors is thus shortened. Therefore it is possible to compensate for the parasitic capacitances of these transistors through circuitry means spatially close to the transistors. This leads to higher bandwidths. In a most preferred way, the connection points are arranged in the middle in opposing edge areas of the substrate.

In another preferred embodiment, the power splitter of the first amplifier stage comprises a plurality of transistors, wherein these transistors are arranged on the substrate essentially mirror symmetric with respect to a connection of the input and the output. Thus a space-saving and uniform arrangement on the substrate is possible.

In another preferred embodiment, the power splitter comprises at least two terminating resistors $R_T$ that are preferably arranged on the substrate opposite each other in the starting area, in particular, preferably essentially mirror symmetric with respect to a connection of the input and the output. This produces the advantage that the first amplifier stage can be arranged on the substrate in a simpler, clearer, and more space-saving way and method.

In another preferred embodiment, the power coupler is formed such that the first series circuit and the second series circuit are arranged on the substrate essentially mirror symmetric with respect to a connection of the input and the output. This makes possible an in-phase joining of the signals of the first series circuit and the second series circuit at the output. This also avoids undesired oscillations.

In another preferred embodiment, the amplifier comprises a plurality of transistors that are formed as semiconductor transistors, in particular, as GaN-based semiconductor transistors. This produces the advantage that the transistors can be formed in a known way in order to achieve satisfactory amplification per transistor surface area.

The amplifier according to the invention is basically suitable for applications in which a wideband amplification is desired. The amplifier according to the invention is therefore advantageously formed for use in monolithic integrated circuits and discrete amplifiers, regardless of the field of technology and material systems. Wideband amplifiers are generally key components in military and commercial applications, e.g., satellite communications and phase-array antennas.

BRIEF DESCRIPTION OF THE DRAWINGS

Additional preferred features and embodiments of the amplifier according to the invention are explained below with reference to embodiment examples and the figures. Shown are.

DETAILED DESCRIPTION OF THE PREFERRED EMBODIMENTS

Figure 1:
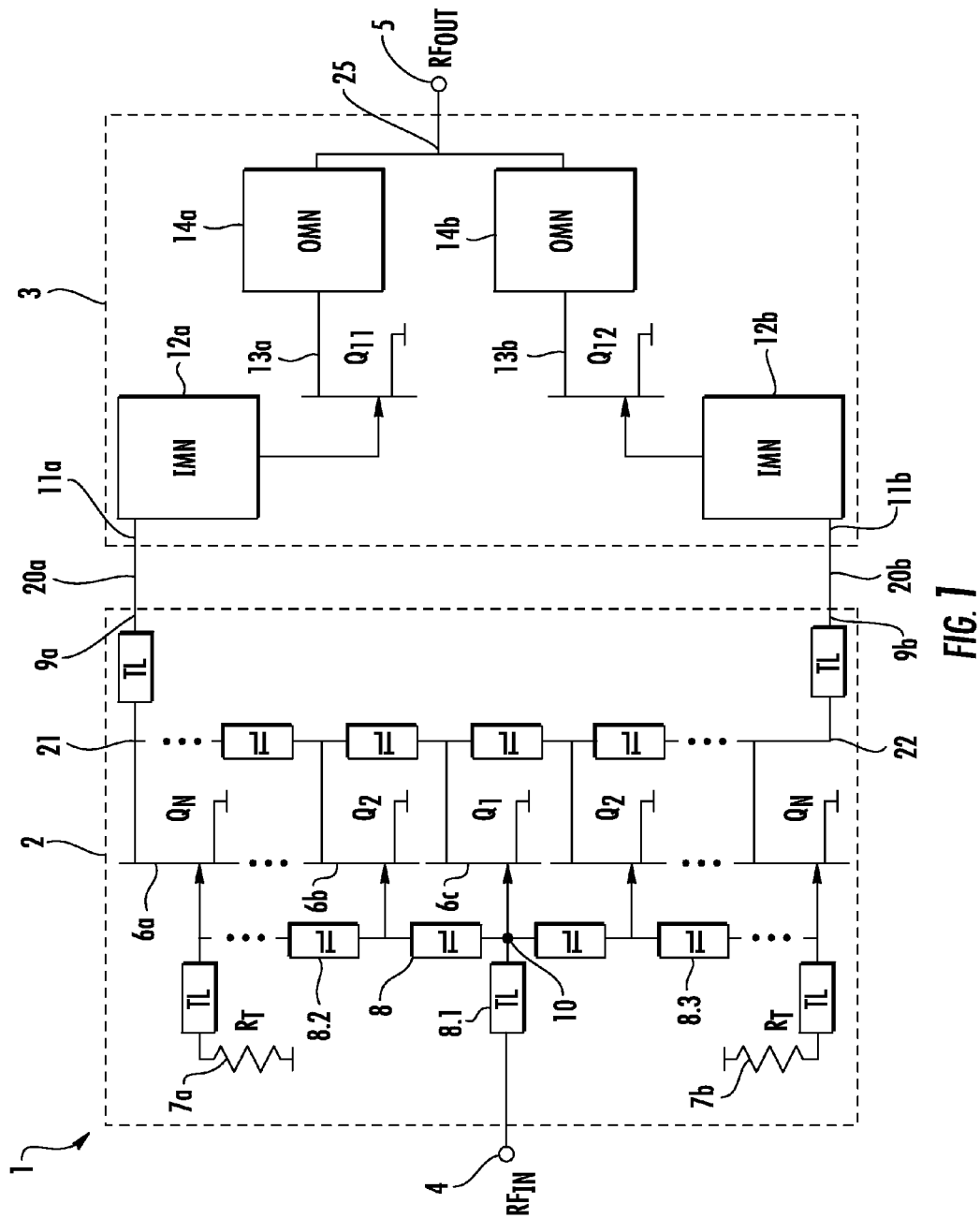
FIG. 1: a schematic diagram of a first embodiment of an amplifier according to the invention.
Figure 2:
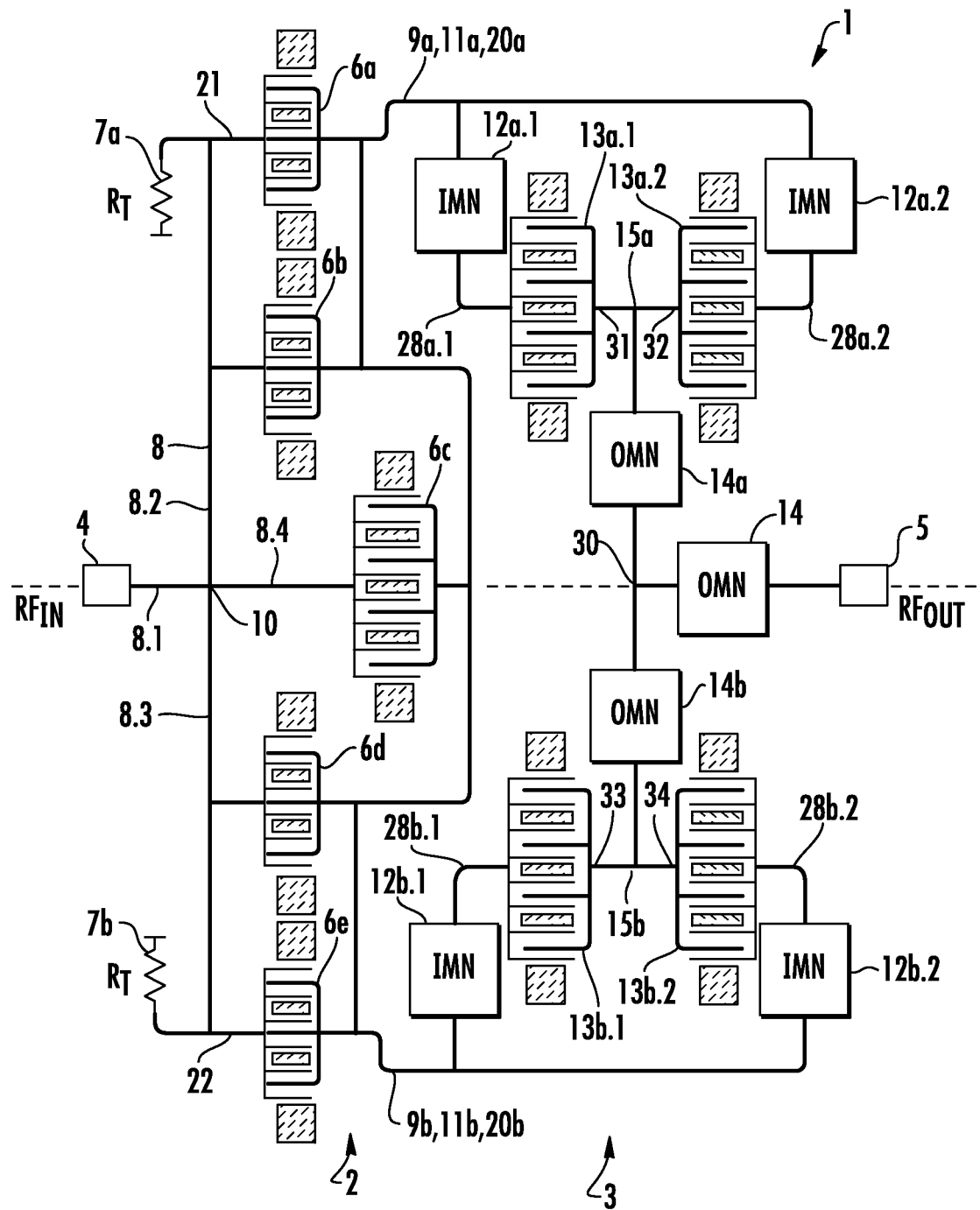
FIG. 2: a schematic diagram of a second embodiment of an amplifier according to the invention.

In FIGS. 1 and 2, identical reference symbols designate elements that are identical or that have identical functions.

FIG. 1 shows a schematic diagram of a first embodiment of an amplifier 1 according to the invention. The amplifier 1 comprises a first amplifier stage 2 and a second amplifier stage 3 and has an input 4 and an output 5. The input 4 is arranged on the first amplifier stage 2. The output 5 is arranged on the second amplifier stage 3. The first amplifier stage 2 is formed as an active power splitter with at least one injection point 4, wherein this injection point 4 corresponds to the input 4 of the amplifier. The active power splitter comprises a plurality of transistors, as an example marked with the reference symbols 6a, 6b, 6c, in the present case, five transistors. In addition, the first amplifier stage 2 has two terminating resistors 7a, 7b that are located at the ends of a transmission line 8.

The first amplifier stage 2 is thus formed according to the principle of a traveling wave amplifier that has, as is known, an injection point 4, but has, deviating from common traveling wave amplifiers, two discharge points 9a, 9b. The traveling wave amplifier is formed symmetric in its arrangement in the present case. Starting from the injection point 4 is an input transmission line 8.1 that continues into the two branched transmission lines 8.2, 8.3. Here, an equal number of transistors 6a, 6b, 6c is arranged on both sides of the branch 10. The transistors 6a, 6b, 6c amplify an input signal and thus produce the amplifying effect of the first amplifier stage 2. The two transmission lines 8.2, 8.3 are terminated with a terminating resistor 7a, 7b. Another branch 21, 22 of each transmission line leads to the discharge points 9a, 9b.

At the discharge points 9a, 9b from the first amplifier stage 2, a pure real resistance is produced, that is, an ohmic resistance is passed via the injection points 11a, 11b to the second amplifier stage 3. The discharge points 9a, 9b and the injection points 11a, 11b are each coupled and form a connection point 20a, 20b between the first amplifier stage 2 and the second amplifier stage 3. In the present case, a resistance in the magnitude of 30Ω is passed to the connection points 20a, 20b.

The second amplifier stage 3 comprises a first input matching network 12a and a second input matching network 12b, a first transistor 13a and a second transistor 13b, and also a first output matching network 14a and a second output matching network 14b. In addition, the first amplifier stage 3 has two injection points 11a, 11b and an discharge point 5. The discharge point 5 corresponds to the output 5 of the amplifier.

As described above, a pure real resistance, that is, an ohmic resistance, is passed to the injection points 11a, 11b of the second amplifier stage 3 from the first amplifier stage 2 via the connection point 20a, 20b. The first input matching network 12a and the second input matching network 12b transform the ohmic resistance into a complex impedance for the transistors 13a, 13b. Here, the actual amplification of the second amplifier stage is realized. Then the complex impedances in the first output matching network 14a and the second output matching network 14b are transformed back into ohmic resistances. The two signals are finally superimposed at the branch 25 and output at the discharge point 5. The transformation of the complex impedances into the pure ohmic resistance is performed as is known for single-stage amplifiers.

The embodiment described here for the amplifier according to the invention has the advantage that operation is possible in a wide frequency range in comparison to matching amplifiers known form the prior art, but the advantages of the amplification by matching amplifiers are maintained.

FIG. 2 shows a schematic diagram of a second embodiment of an amplifier 1 according to the invention. The amplifier 1 comprises a first amplifier stage 2 and a second amplifier stage 3 and has an input 4 and an output 5. The input 4 is arranged on the first amplifier stage 2. The output 5 is arranged on the second amplifier stage 3.

The first amplifier stage 2 is formed as an active power splitter with at least one injection point 4, wherein this injection point 4 corresponds to the input 4 of the amplifier. The active power splitter comprises, in the present case, five transistors marked with the reference symbols 6a, 6b, 6c, 6d, 6e. The transistors 6a, 6b, 6d, and 6e each have six transistor fingers. The transistor 6c arranged in the middle has eight transistor fingers. In addition, the first amplifier stage 2 has two terminating resistors 7a, 7b that are located at the ends of a transmission line 8.

The first amplifier stage 2 is thus formed according to the principle of a traveling wave amplifier that has, as is known, an injection point 4, but, deviating from common traveling wave amplifiers, two discharge points 9a, 9b. The traveling wave amplifier is formed symmetric in its arrangement in the present case. Starting from the injection point 4 is an input transmission line 8.1 that continues into the branched transmission lines 8.2, 8.3 and the transmission line 8.4. Here, on both sides of the branch 10 there are two transistors, on the left the transistors 6a, 6b, on the right the transistors 6d, 6e. The transmission line 8.4 leads to the transistor 6c. The transistors 6a, 6b, 6c, 6d, 6e amplify an input signal and thus produce the amplifying effect of the first amplifier stage 2. Both transmission lines 8.2, 8.3 terminate with a terminating resistor 7a, 7b. Another branch 21, 22 of each transmission line leads to the discharge points 9a, 9b via the transistors (6a, 6e).

At the discharge points 9a, 9b from the first amplifier stage 2, a pure real resistance, that is, an ohmic resistance is passed via the injection points 11a, 11b to the second amplifier stage 3. The discharge points 9a, 9b and the injection points 11a, 11b are each coupled and form a connection point 20a, 20b between the first amplifier stage 2 and the second amplifier stage 3.

In connection to the injection point 11a, the second amplifier stage 3 comprises a first input matching network 12a.1 and a second input matching network 12a.2. The first input matching network 12a.1 is connected via a line 28a.1 to a first transistor 13a.1. The second input matching network 12a.2 is connected via a line 28a.2 to a second transistor 13a.2. The first input matching network 12a.1 and the second input matching network 12a.2 transform the ohmic resistance into a complex impedance for the transistors 13a.1, 13a.2. The actual amplification of the second amplifier stage takes place in the transistors 13a.1, 13a.2. The transistors 13a.1, 13a.2 are arranged as two opposing transistors. Here, the two drains 31, 32 of the transistors are turned toward each other. The two transistors 13a.1 and 13a.2 are connected to each other via a line 15a. The arrangement produces the advantage that the distance 15a between the drains 31, 32 of opposite transistors can be minimized. Advantageously, this line 15a is designed as short as possible. Through this short connection 15a, a spatially close compensation of the parasitic capacitances of the two transistors 13a.1 and 13a.2 is made possible. The compensation of the parasitic capacitances of the two transistors 13a.1 and 13a.2 is performed by the first output matching network 14a. The first output matching network 14a is further connected to the terminating output matching network 14. In the output matching networks 14a, 14, the complex impedances are transformed back into ohmic resistances and output to the discharge point 5. The discharge point 5 corresponds to the output 5 of the amplifier 1.

Connected to the injection point 11b, the second amplifier stage 3 comprises a third input matching network 12b.1 and a fourth input matching network 12b.2. The third input matching network 12b.1 is connected via a line 28b.1 to a third transistor 13b.1. The fourth input matching network 12b.2 is connected via a line 28b.2 to a fourth transistor 13b.2. The third input matching network 12b.1 and the fourth input matching network 12b.2 transform the ohmic resistance into a complex impedance for the transistors 13b.1, 13b.2. In the transistors 13b.1, 13b.2, the actual amplification of the second amplifier stage takes place. The two transistors 13b.1 and 13b.2 are connected to each other via the line 15b. Advantageously, this line 15b is also designed as short as possible. Through the short connection 15b, a spatially close compensation of the parasitic capacitances of the two transistors 13b.1 and 13b.2 analogous to the transistors 13a.1 and 13a.2 is also made possible here. The compensation of the parasitic capacitances of the two transistors 13b.1 and 13b.2 takes place through the second output matching network 14b. The second output matching network 14b is connected at the connection point 30, like the first output matching network 14a connected to the terminating output matching network 14. In the output matching networks 14a, 14b, 14, the complex impedances are transformed back into ohmic resistances, superimposed at the connection point 30, and output at the discharge point 5.

The first amplifier stage 2 and the second amplifier stage 3 are formed essentially mirror symmetric with respect to a middle axis M.

The invention claimed is:

1. An amplifier with an input and an output, comprising a first amplifier stage and a second amplifier stage, the first amplifier stage includes an active power splitter with at least one injection point that corresponds to the input of the amplifier, and at least two discharge points, the active power splitter is formed according to a traveling wave amplifier principle, and the second amplifier stage has at least two injection points and at least one discharge point, the discharge point corresponds to the output of the amplifier, and the second amplifier stage is formed as a power coupler that operates according to a reactively matched amplifier principle.

2. The amplifier according to claim 1, wherein
the second amplifier stage comprises at least two input-matching networks, at least two transistors, and at least two output-matching networks, and an input transformation of a real input resistance into a complex impedance is performed in each of the input matching networks and an output transformation of the complex impedance into a real output resistance is performed in each of the output matching networks.

3. The amplifier according to claim 1, wherein
the power coupler is formed such that a first series circuit made from a first input matching network, a first transistor, and a first output matching network is coupled with a second series circuit made from a second input matching network, a second transistor, and a second output matching network.

4. The amplifier according to claim 3, wherein
the power coupler is formed and arranged on a substrate such that a distance between the first input matching network and the second input matching network is greater than a distance between the first output matching network and the second output matching network.

5. The amplifier according to claim 1, wherein
at least one of the first amplifier stage or the second amplifier stage comprises an integrated circuit.

6. The amplifier according to claim 1, wherein
the at least two discharge points of the first amplifier stage are each coupled with an associated injection point of the at least two injection points of the second amplifier stage.

7. The amplifier according to claim 1, wherein
a real resistance is passed between the discharge points of the first amplifier stage and the associated injection point of the second amplifier stage.

8. The amplifier according to claim 4, wherein
the input of the amplifier is arranged essentially centrally in a starting area of the substrate, or the output of the amplifier is arranged essentially centrally in an end area of the substrate, or both.

9. The amplifier according to claim 4, wherein
the amplifier comprises two of the discharge points of the first amplifier stage and two of the injection points of the second amplifier stage, and the two discharge points of the first amplifier stage and the two injection points of the second amplifier stage are arranged in opposite edge areas of the substrate.

10. The amplifier according to claim 4, wherein
the active power splitter of the first amplifier stage comprises a plurality of transistors, and said transistors are arranged on the substrate essentially mirror symmetric with respect to a connection of the input and the output.

11. The amplifier according to claim 4, wherein the power coupler is formed such that the first series circuit and the second series circuit are arranged on the substrate essentially mirror symmetric with respect to a center axis.

12. The amplifier according to claim 4, wherein a plurality of transistors of the first amplifier stage is formed on the substrate with respect to their physical properties essentially mirror symmetric with respect to a center axis.

13. The amplifier according to claim 4, wherein physical properties of the first series circuit and physical properties of the second series circuit are formed on the substrate essentially mirror symmetric with respect to a center axis.

14. The amplifier according to claim 4, wherein the active power splitter of the first amplifier stage comprises at least two terminating resistors RT that are arranged on the substrate mutually opposite in a starting area.

15. The amplifier according to claim 1, further comprising a plurality of transistors that are formed as semiconductor transistors.

* * * * *